United States Patent [19]

Metz et al.

[11] 4,305,045

[45] Dec. 8, 1981

[54] PHASE LOCKED LOOP CLOCK SYNCHRONIZING CIRCUIT WITH PROGRAMMABLE CONTROLLER

[75] Inventors: Reinhard Metz, Oswego; David F. Winchell, Glen Ellyn, both of Ill.

[73] Assignee: Bell Telephone Laboratories, Incorporated, Murray Hill, N.J.

[21] Appl. No.: 94,230

[22] Filed: Nov. 14, 1979

[51] Int. Cl.³ ............................................. H03L 7/08
[52] U.S. Cl. ................................. 331/1 A; 331/2; 331/17; 331/25; 331/27; 331/34
[58] Field of Search ..................... 331/1 A, 2, 14, 17, 331/18, 25, 27, 34, 49, 55

[56] References Cited

U.S. PATENT DOCUMENTS

| | | | |
|---|---|---|---|
| 3,769,607 | 10/1973 | Thelen | 331/2 |
| 3,795,872 | 3/1974 | Napolitano et al. | 331/49 |
| 4,156,200 | 5/1979 | Gomez | 328/61 |

OTHER PUBLICATIONS

Saltzberg et al., "Network Synchronization", The Bell System Technical Journal, May–Jun. 1975, pp. 879–892.

Primary Examiner—Siegfried H. Grimm
Attorney, Agent, or Firm—P. Visserman

[57] ABSTRACT

A clock synchronization unit for controlling frequency and phase of a local clock and synchronism with an external clock signal, employs a programmable controller as a part of a phase-locked loop. The controller provides highly accurate control of the clock, including verification of the accuracy of the clock control signal before applying it to the clock oscillator as well as control of the magnitude to the clock oscillator to avoid rapid changes in frequency. In one particular embodiment, the programmable controller comprises duplicated microprocessors which perform operations in step. In a master/slave oscillator arrangement, the controller controls the slave clock oscillator as well as the master to assure tracking of the slave to the master.

11 Claims, 9 Drawing Figures

FIG. I 4,305,045

PHASE LOCKED LOOP CLOCK SYNCHRONIZING CIRCUIT WITH PROGRAMMABLE CONTROLLER

BACKGROUND OF THE INVENTION

This invention relates to clock circuits for use in systems for handling digital data, and more particularly, relates to circuit arrangements for synchronizing clock circuits in digital communication switching centers.

PRIOR ART

It is well recognized that it is desirable to be able to transmit digital data from one communication switching center to another synchronously. However, if the average output rate at which data bits are transmitted from one center is not exactly equal to the average input rate at the other center, errors occur. Such errors are defined as slips. This means that bits are arbitrarily deleted if the input rate exceeds the output rate or that bits are repeated or inserted arbitrarily if the input is slower than the output rate. To assure synchronization and avoid slips, a timing signal may be transmitted along with the transmitted data or a common synchronization signal may be transmitted to both the transmitting and the receiving center. Each center will include a local timing signal generator, referred to as a local clock, which generates a continuous stream of timing signals at a selected frequency. To accomplish synchronization of the local clock to an external signal, the local clock must be adjusted to produce a signal of the same frequency as that of the external signal. One prior art synchronization arrangement is described in *The Bell System Technical Journal*, Volume 54, No. 5, May-June, 1975, pp. 879-892. The arrangement described in this article includes a phase-locked loop including a phase comparator which compares the signal generated by the local clock with the signal received from the external source and circuits for computing a 14-bit digital word used to control the frequency of the local oscillator. The disclosed arrangement comprises an integrator circuit and an adder circuit which are used to compute the oscillator control word. Reliability is provided in the prior art arrangement by fully duplicated phase-locked loops generating independent oscillator output signals. In such a system the oscillator output signals may be compared to determine that one of the oscillators or phase locked loops is faulty. However, no provision is made to determine which of the two oscillators is operating properly.

SUMMARY OF THE INVENTION

In accordance with this invention, a clock synchronization unit comprises a highly reliable self-checking programmable controller in a phase-locked loop. Clock oscillators customarily are reliable devices which will run for long periods of time with a minor drift from the true frequency. Therefore, it is more important that the correct information be applied to the oscillator than that the oscillator receive control signals at regular intervals. Accordingly, in accordance with the invention a highly reliable computer is used to generate the digital oscillator control signals, which performs validity checks on the generated signals and inhibits the application of further control signals to the oscillator circuit in the event of an error condition. Advantageously, the phase-locked loop elements need not be duplicated since the control signals have a high probability of correctness and the oscillator will be placed in a free run mode when an error condition is detected. In prior art systems errors resulting from incorrectly computed control words are not discovered until after the oscillator has reacted to the incorrect control word. In accordance with one aspect of the invention, control signals in the form of a digital control word are transmitted to the digitally controlled oscillator and are returned from the oscillator to the programmable controller. The returned control word is matched against the transmitted control word and corrective action is taken before the oscillator responds to an incorrect control word. In accordance with another aspect of the invention, the programmable controller comprises two processors independently performing the generation of control signals. Both processors compare their own generated control word with the generated control word of the other processor. Furthermore, a matching arrangement is provided to assure that a control word transmitted from the duplicated processors will not be accepted by the oscillator unless addressing information and control information generated by the two processors is identical. In accordance with another aspect of the invention, the clock circuit comprises master and slave oscillators and phase correcting circuits provide an analog signal to the slave oscillator when its frequency differs from the master. The controller monitors the analog correction signal and provides digital control to the slave oscillator to minimize the deviation from the master. In accordance with another aspect of the invention, the phase-locked loop operates in either a fast mode or a normal mode and the controller switches from the fast mode to the normal mode on the basis of the amount and rate of change of detected phase error. The programmable controller monitors the presence of the reference signal and allows the master oscillator to free run when a reference is lost. When the reference returns the phase-locked operation will be resumed automatically. Furthermore, the controller monitors the phase difference between the local clock and the reference signal and circuitry is provided to adjust the phase of the reference signal under control of the controller. The programmable controller also performs checks on the generated control words to determine whether the oscillator correction is within a predetermined range. If it is greater than a predetermined amount, the control word is altered in preselected steps. In case an error is detected by the controller, the controller will delay any further writing of control words to the oscillator and will allow the oscillator to enter into a free run mode.

DETAILED DESCRIPTION

Figure 1:
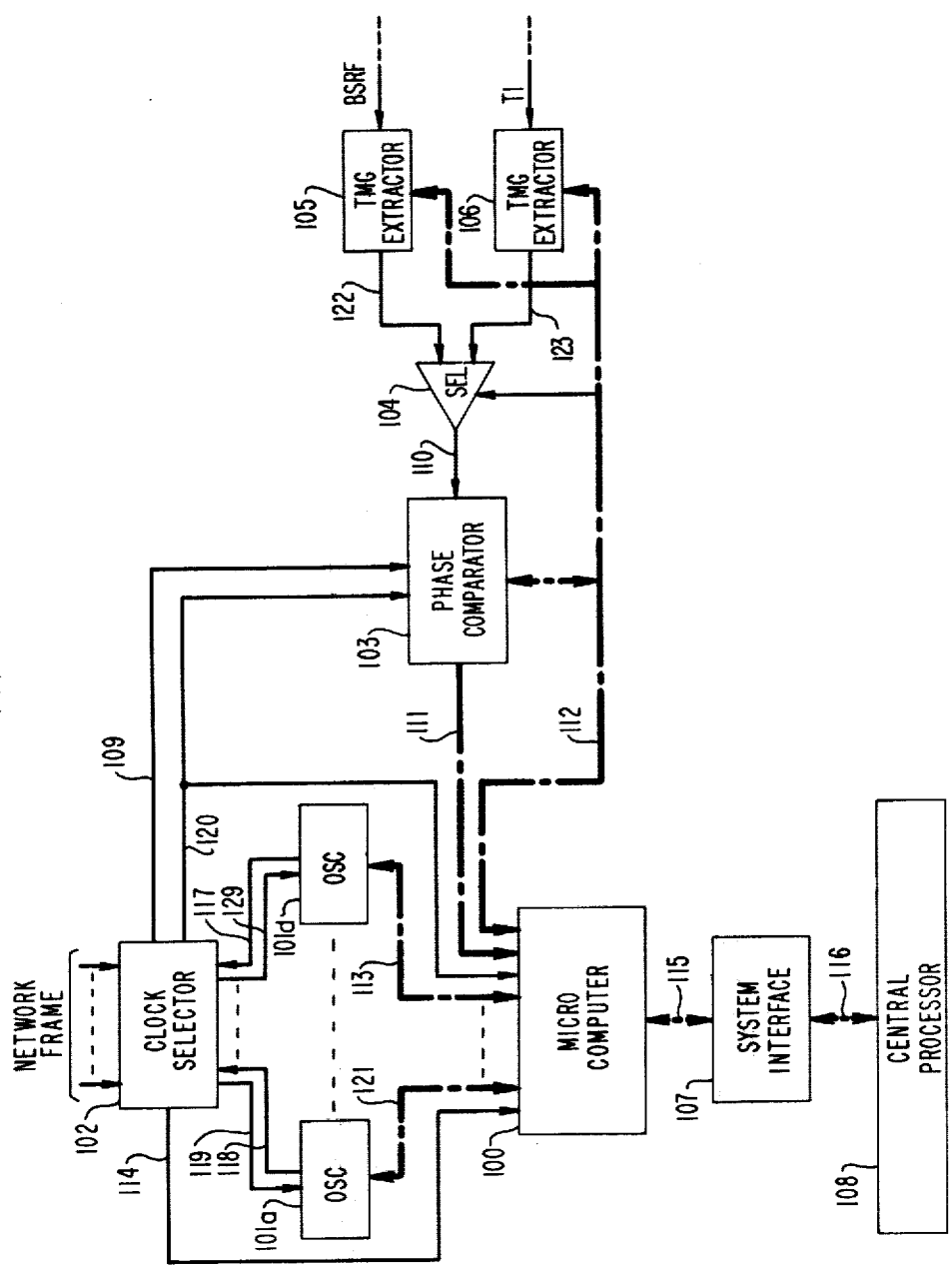
FIG. 1 is a block diagram representation of a clock synchronizing unit in accordance with the invention.

An illustrative embodiment of a clock pulse generator synchronizing circuit is shown in FIG. 1. The circuit may be used in conjunction with a digital time division switching system such as Western Electric's No. 4 ESS described in *The Bell System Technical Journal*, Volume 56, No. 7, September, 1977. This synchronizing circuit is a basic element of the system network clock which provides the basic timing and synchronization for the switching system. The network clock is a stable and accurate source of timing pulses which comprises a plurality of controllable oscillators. In this illustrative embodiment the network clock comprises a plurality of 16.384 megahertz crystal oscillators. Only two oscillators, namely, 101-*a* and 101-*d* are shown in the drawing. The oscillators normally run in a mode wherein any one of the oscillators may be designated as the master by means of a clock selector 102 and the remaining oscillators will be slaves. Clock selector 102 may be of the type generally described in U.S. Pat. No. 3,769,607 of W. Thelen. In addition to selection circuitry for designating master oscillator, the selector 102 includes analog phase lock circuitry which provides analog correction signals on conductors 119, 129 when the corresponding oscillator is a slave. The oscillators together with clock selector 102, form essentially a phase-locked loop with phase comparator 103 and microcomputer 100.

For the purposes of their description, it is assumed that oscillator 101-*d* is the master oscillator. By means of clock selector 102, the 16.384 megahertz output signal of oscillator 101-*d* and a derived signal are are transmitted via conductors 109 and 120 to the phase comparator 103, where phase of the oscillator signal is compared with that of an externally supplied reference signal. The reference signal may for example, be a standard signal supplied simultaneously to a plurality of switching offices such as the Bell System Reference Frequency (BSRF) or a timing signal derived from a T1 carrier from a distant office. Either of these signals may be applied to phase comparator 103 by means of selector 104 which is operated under control of microcomputer 100 via cable 112. Phase comparator 103 is described later herein with respect of FIG. 4. Selector 104 may be a standard logic circuit which may be controlled to selectively pass either one or the other of the two external reference signals.

Microcomputer 100 performs the basic feedback filtering functions of a more conventional phase-locked loop. Based on machine instructions contained in firmware and the phase error signal from phase comparator 103, microcomputer 100 computes control signals in the form of a binary word and transmits this control word to the master oscillator. Microcomputer 100 receives information from clock selector 102 via cable 114, defining which of the oscillators is the master. Phase comparator 103 provides a 9-bit word on cable 111 which is representative of the state of a binary counter in the phase comparator. The counter indicates both magnitudes and direction of the phase deviation between the signals applied to the comparator. Microcomputer 100 uses the contents of this counter to adjust the master oscillator. The counter in phase comparator 103 is reinitialized with a 4 kilohertz pulse, and, hence, phase comparison is done every 250 microseconds. Microcomputer 100 reads the contents of the counter via cable 111 and uses the 9-bit word in the computation of a 14-bit master oscillator control word. Microcomputer 100 performs computation and control over an 8.192-second cycle. The computation of the 14-bit word transmitted to the master oscillator is done by sampling for 1-second intervals. In each 8.192-second cycle, microcomputer 100 determines how many 1-second computations can be performed. During a 1-second interval, the microcomputer 100 reads $2^{12}$ such 9-bit words from phase comparator 103 and forms an average error word. This average word is then multiplied by $2^{-12}$ and added to a running sum called the integral term. Finally, the integral sum and the average error word are added together to form the 14-bit control word which is added to a sum of the 14-bit control words. After all the 1-second intervals have been performed, the average is computed from the sum of 14-bit control words and the resulting 14-bit control word is transmitted to the master oscillator. The resulting 14-bit word is also used to calculate the 14-bit control words to be transmitted to the slave oscillators. Each 9-bit error word read from phase comparator 103 is compared against the previous error word to detect potential error conditions. If the present error word does not fall within a specified range of the previous error word and microcomputer 100 determines that external reference has been momentarily lost, microcomputer 100 adjusts the phase of the external reference as described in the next paragraph.

Microcomputer 100 is connected via cable 112 to timing extractor circuits 105 and 106, which receive the BSRF and the T1 reference signals, respectively. Microcomputer 100 monitors the reference signals via phase comparator 103. When loss of reference is detected, further correction of the oscillators is halted. Upon return of the reference signal, the microcomputer may resume the controlling of the oscillators. A time delay of several seconds is usually introduced before correcting the oscillators after a reference has been returned to allow for stabilization of the reference signal. The microcomputer can also control the extractor circuits to introduce a phase shift in the reference signal. For example, when a large phase discrepancy exists, which results from initialization or momentary loss of the external reference, between the master oscillator and the reference signal, the microcomputer will control the extractors to shift the phase of the reference signal to minimize the discrepancy.

The communication switching system of which the clock circuit is a part, comprises a central processor 108 which communicates with the microcomputer 100 via system interface 107 and interconnecting buses 115 and 116. Through system interface 107, central processor 108 can transmit control information to and receive other information from microcomputer 100. The system interface 107 comprises essentially a plurality of buffer circuits for receiving and retransmitting the information, and may be connected to the central processor 108 and microcomputer 100 by means of well-known direct memory access arrangements or other peripheral connections.

The phase-locked loop arrangement comprising the master oscillator 101-*d*, clock selector 102, phase comparator 103 and microcomputer 100 may be operated in a normal mode or in a fast mode. The fast mode is used in certain conditions such as system initialization or when changing from one external reference to the other to allow the system to correct more rapidly for differences in frequency. The fast mode differs from the normal mode which has previously been described in that in the fast mode the phase error is given a greater weight and the integral sum is built up faster. During the 1-second computation interval in the fast mode, the average error word formed is multiplied by $2^{-1}$, rather than $2^{-12}$ as in the normal mode, and the result is added to the running sum called the integral term. Finally, the integral sum and the average error word multiplied by $2^5$ are added together to form the 14-bit control word which is sent to the master oscillator. In the normal mode, the 14-bit control word was formed by adding the integral sum and the average error word together. After the rate of frequency change has decreased below a threshold value, microcomputer 100 will automatically switch from fast mode to normal mode.

Figure 2:
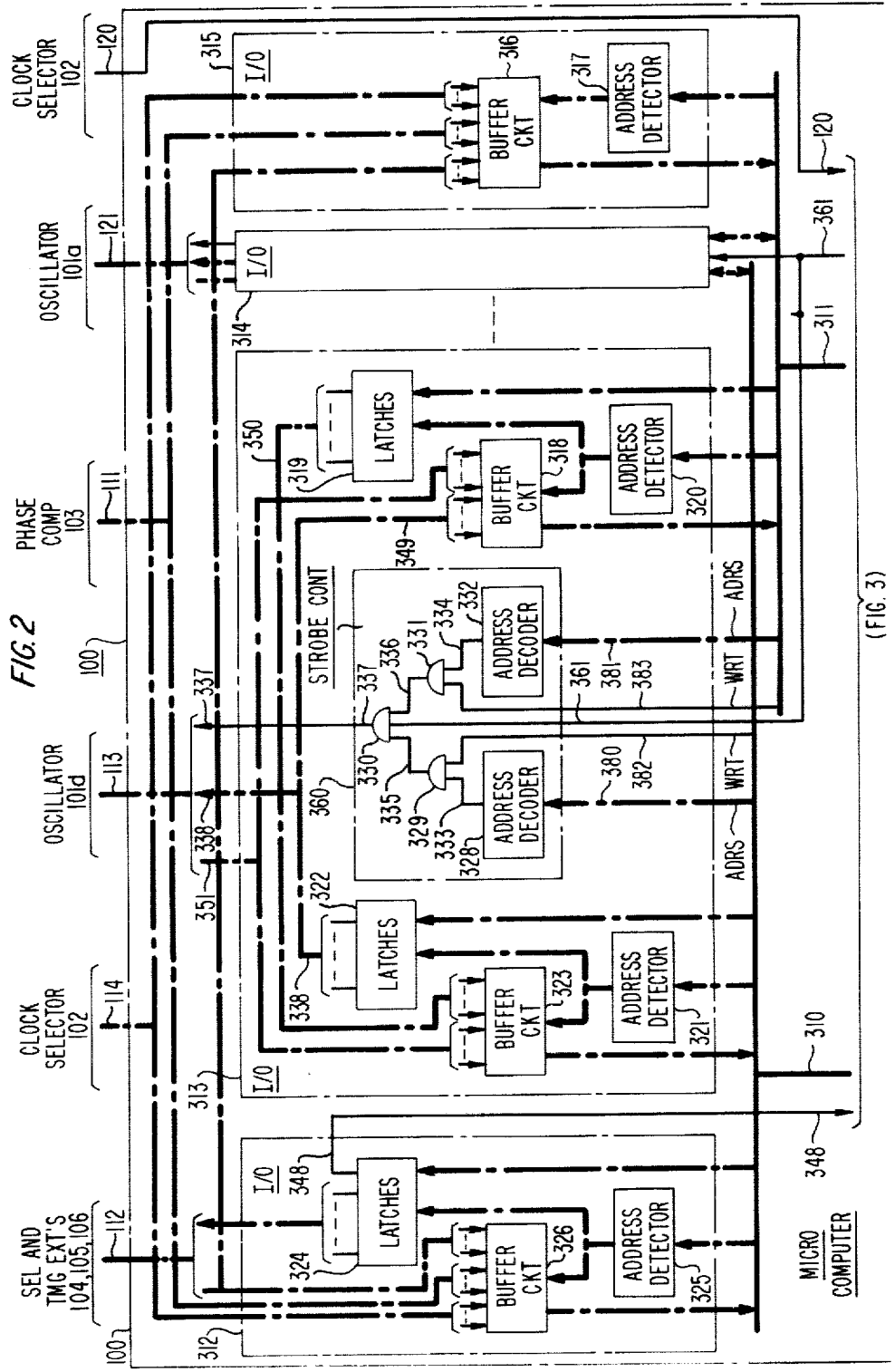
FIGS. 2 and 3 together show a more detailed representation of the microcomputer of FIG. 1.
Figure 3:
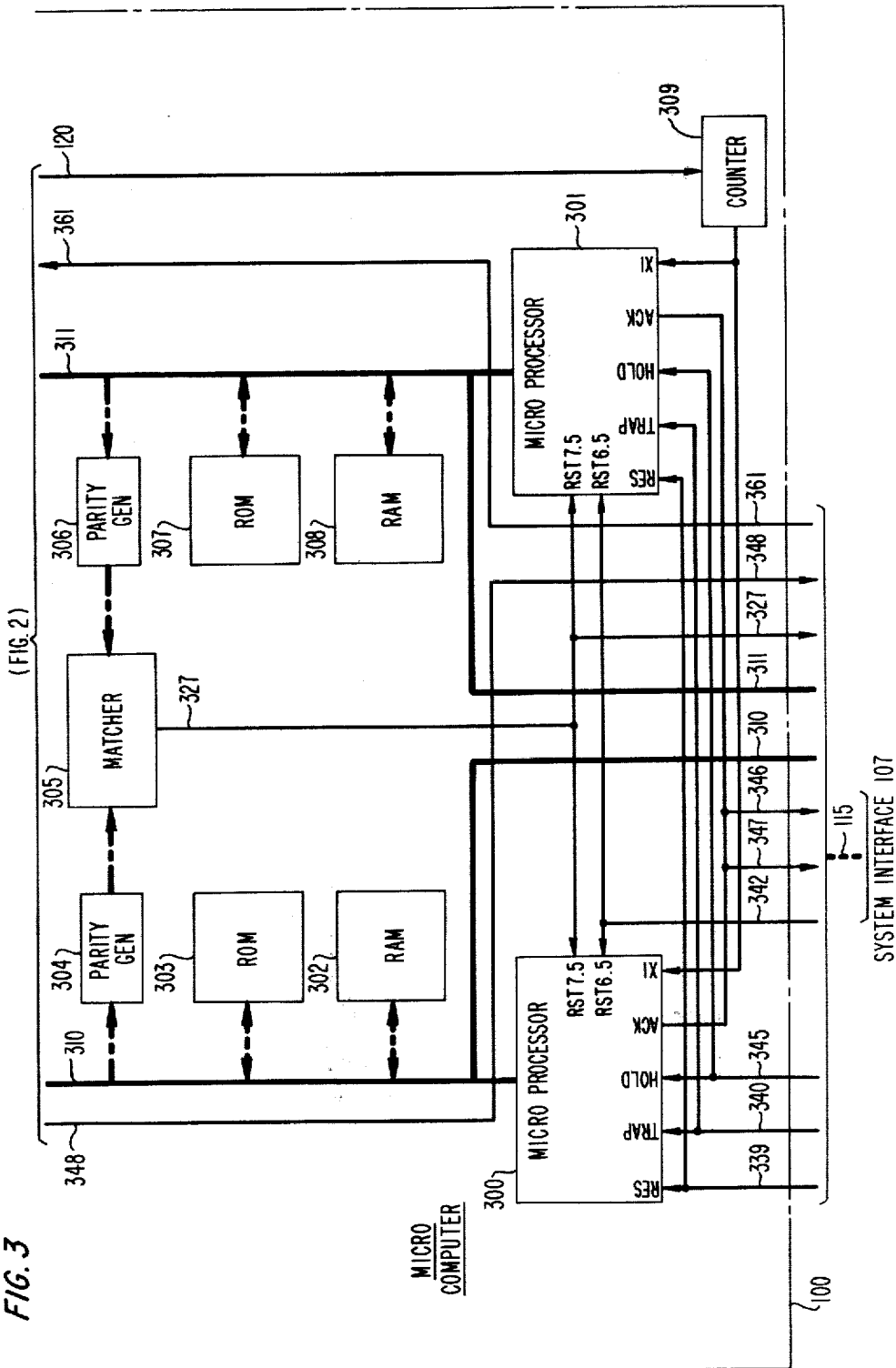

Microcomputer 100, which is shown in greater detail in FIGS. 2 and 3, comprises duplicated microprocessors 300 and 301. The microprocessor may, for example, be the commercially available Intel MCS-8085 microprocessors. Microprocessor 300 is the master microprocessor and has associated with it random access memory, RAM, 302, read only memory, ROM, 303, input/output, I/O 312, I/O 313, and I/O 314. Microprocessor 301 is used to provide error detection for microprocessor 300. Microprocessor 301 has associated with it RAM 308, ROM 307, I/O 131, I/O 314, and I/O 315. Microprocessor 300 performs the various required control functions by executing a firmware program contained in ROM 303. Microprocessor 301 executes a copy of the same program stored in ROM 307 in synchronism with microprocessor 300. Buses 310 and 311 are used to transmit address, data, and control signals between microprocessor 300 and 301, respectively, and their associated memories and I/O units. Microcomputer 100 transmits data to the other elements of the clock circuit of FIG. 1 such as the oscillators by transmitting information via I/O 312, I/O 313, or I/O 314 under control microprocessor 300. I/O 314 is the interface for oscillator 101-a and is substantially identical in structure to I/O 313. I/O 313 is shown in greater detail, and is the interface for oscillator 101-d. If additional oscillators are added to the circuit of FIG. 1, then additional circuits similar to I/O 313 must be added to the circuit of FIG. 2. Microcomputer 100 receives data from the elements of the clock circuit of FIG. 1 data via I/O 312, I/O 313, I/O 314 and I/O 315 under control of both microprocessors. I/O units 312 through 315 consist primarily of buffer circuits (316, 318, 323, 326), latches (319, 322, 324) and address detectors (317, 320, 321, 325), connected to bus 310 or 311. The buffer circuits are essentially a plurality of signal receiving circuits which replicate data occurring on the conductors connected thereto. The states of the buffer circuits may be read by the microprocessors. The latches are essentially flip-flops or the like which may be written into from the microprocessors. The address detectors respond to preselected addresses to generate control signals to enable the buffer circuits and the latches. Microprocessor 300 and microprocessor 301 access the buffer circuits and the latches of their respective I/O elements by performing read and write commands, similar to memory access operations. For example, in I/O 312, the latches 324 may be accessed as memory locations with respect to write operations for microprocessor 300, and the buffer circuits 326 may be accessed as memory locations with respect to read operations for microprocessor 300.

Data transmitted to the oscillators via the appropriate I/O unit must be accompanied by a strobe signal before it will be written into an internal register in the oscillator. Accordingly, data transmitted to oscillator 101-d from latches 322 over conductors 338 must be accompanied by a pulse from strobe control circuit 360. Strobe control circuit 360 is essentially an address matching circuit. When the control word in latches 332 is ready to be entered into register 501 of oscillator 101-d, the microprocessors each transmit an address identifying strobe control circuit 360 and a write control signal on the associated bus (310, 311). The addresses are applied to decoders 328 and 332 by address conductors 380 and 381, respectively. When the proper address is received by the decoders, a "1" is transmitted on conductors 333 and 334. Since a "1" occurs on write leads 382 and 383 simultaneous with the decoding of the proper address, AND gate 329 and AND gate 331 will each transmit a "1" to AND gate 330 via conductors 335 and 336. These conditions cause AND gate 330 to transmit a pulse on conductor 337. Thus, the strobe signal is generated and the control word is entered in register 501 only when both microcomputers transmit the appropriate address and write control signals. Conductor 361 is provided to inhibit gate 330 in the event that an error condition flip-flop is set in error register 805.

Microcomputer 100 writes information to timing extractor 105 by performing a write operation to latches 324 which writes 5-bits into the latches whose contents are transmitted to a register in timing extractor 105 via cable 112. Microcomputer 100 reads the phase error word from phase comparator 103 by executing a read operation from buffer circuits 326 which reads the buffers connected to the counter in phase comparator 103 via cable 111. Selector 104 is controlled by transmitting a "1" or a "0" on conductor 124 via cable 112 from the appropriate latch in latches 324. In order that microprocessor 301 can read the same data as microprocessor 300 conductors, which are transmitting data to microcomputer 100, in cables 111, 112 and 114 are connected to buffer circuit 316. Microprocessor 301 reads these conductors connected to buffer circuit 316 in synchronism with microprocessor 300. Microprocessor sets the error indication flip-flop associated with conductor 348 in the error register of system interface 107 by transmitting a "1" on conductor 348. Microprocessor cause a "1" to be transmitted on conductor 348 by writing a "1" into the latch connected to conductor 348 in latches 324.

Microprocessors 300 and 301 receive a clock signal for internal timing from counter 309 which counts down the 16.384 megahertz clock signal which is transmitted from clock selector 102 on conductor 120. Since the two microprocessors receive the same clock and have identical programs, they are expected to perform all operations in parallel. Parity matching circuitry is provided to monitor the parallel program executions. Parity generator 304 generates parity for the address and data on bus 310, and parity generator 306 generates parity for the address and data on bus 311. During the execution of an instruction fetch by the microprocessors 300 and 301, matcher 305 compares the parity generated by the two parity generators. If the parity does not match, matcher 305 causes an interrupt to microprocessors 300 and 301 via conductor 327 and causes an error indication flip-flop in error register 805 to be set. This causes strobe control circuit 360 to be inhibited via conductor 361 preventing further transmission of control words to the oscillator.

Microprocessors 300 and 301 control oscillator 101-d via I/O 313 and cable 113. Similarly, oscillator 101-a is controlled via I/O 314 and cable 121. Only the data from microprocessor 300 is actually transmitted to the oscillators. To transmit data to oscillator 101-d, both microprocessor 300 and 301 store a 14-bit word in latches 322 and 319, respectively. In this illustrative embodiment, the microprocessors are adapted to generate 8-bit words. Accordingly, to write a 14-bit word in the latches requires the execution of two write instructions. Before transmission to the oscillator, the data is checked to verify that the correct information was written into the latches. This verification is done by causing microprocessor 300 to read the 14-bit word written into latches 319 via conductors 350 and buffer circuits 223 and by causing microprocessor 301 to read the 14-bit word written into latches 322 via conductors 349 via buffer circuits 318. Each of the two microprocessors then verifies that the word read from the latches of the other microprocessor is the same as the word written into its associated latches. If the comparison fails a flip-flop will be set in error register 805 via latches 324 and the data in the latches 322 will not be transferred to the oscillator. If no mismatch occurs, both microprocessors perform a write operation using the address identifying strobe control circuit 360 to cause a strobe pulse to be transmitted via conductor 337, as was previously described. The strobe pulse will cause the data in latches 322 to be written into the internal register 501 of oscillator 101-d. The 14-bit internal register 501 of oscillator 101-d is connected to buffer circuits 318 and 323 via conductors 351. As a further check on the data received by the oscillator, the microprocessors will read the states of the buffer circuits 318 and 323 and compare the "echo" word received from the oscillator with the transmitted word. If a mismatch occurs, the microprocessors immediately attempt to restore the internal register of oscillator 101-d to the condition of the register prior to the latest data transfer, to prevent the oscillator from reacting to an incorrect control word.

Figure 8:
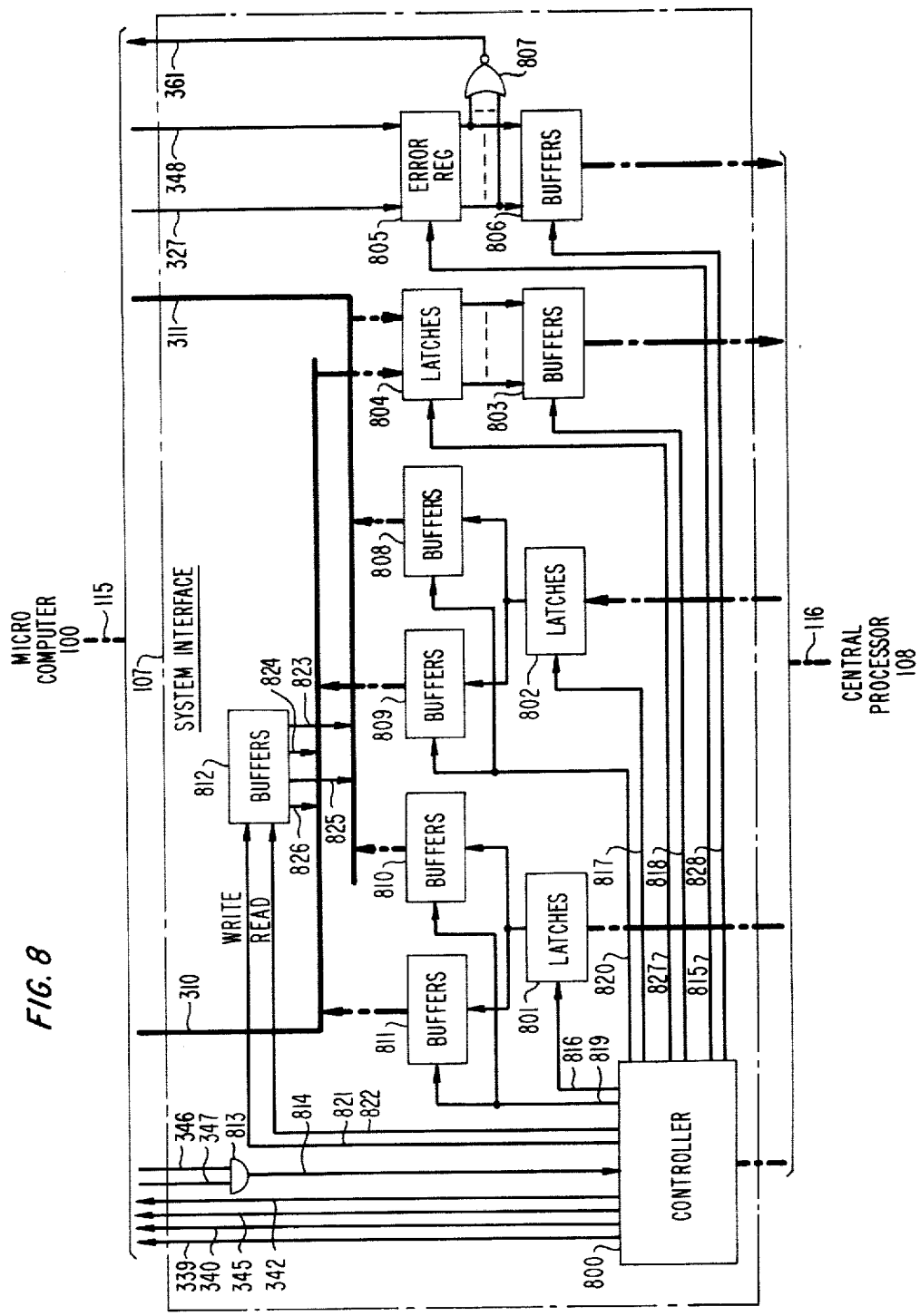
FIG. 8 is a schematic representation of the system interface of FIG. 1.

The control processor 108 has access to the microprocessors via system interface 107 which is shown in greater detail with reference to FIG. 8. It is connected to the microprocessors by the several conductors of cable 115, as represented in FIG. 3. To initialize the microprocessors, a pulse is first applied on conductor 339 to the RESET terminals of microprocessors 300 and 301, which causes the microprocessors to perform a hardware reset and execute a halt instruction. Next, a pulse is transmitted on conductor 340 to the TRAP input terminals of microprocessors 300 and 301, which causes both microprocessors to start executing the initialization routine.

Other communications between system interface 107 and the microprocessors is by access to designated areas within RAMs 302 and 308. To write data into RAMs 302 and 308, system interface 107 transmits a "1" on conductor 345 which is connected to the HOLD input terminals of the microprocessors. A "1" at the HOLD input terminals causes the microprocessors to finish the current instruction, electrically disconnect from buses 310 and 311, and transmit acknowledge signals on conductors 347 and 346. After the system interface 107 receives the acknowledge signals, it transmits identical address and data signals and a write pulse to buses 310 and 311 via conductors 341 and 344, respectively. This causes the same data to be written into the same address locations in both RAMs 302 and 308. After the data has been written into the proper locations in the two RAMs, system interface 107 transmits a "0" on conductor 345 which allows the microprocessor to resume processing. To inform the microprocessors that a message has been placed in RAMs 302 and 308, system interface 107 transmits a pulse on conductor 342 which causes an interrupt. In response to the interrupt, the microprocessors execute a routine to process the message.

Figure 4:
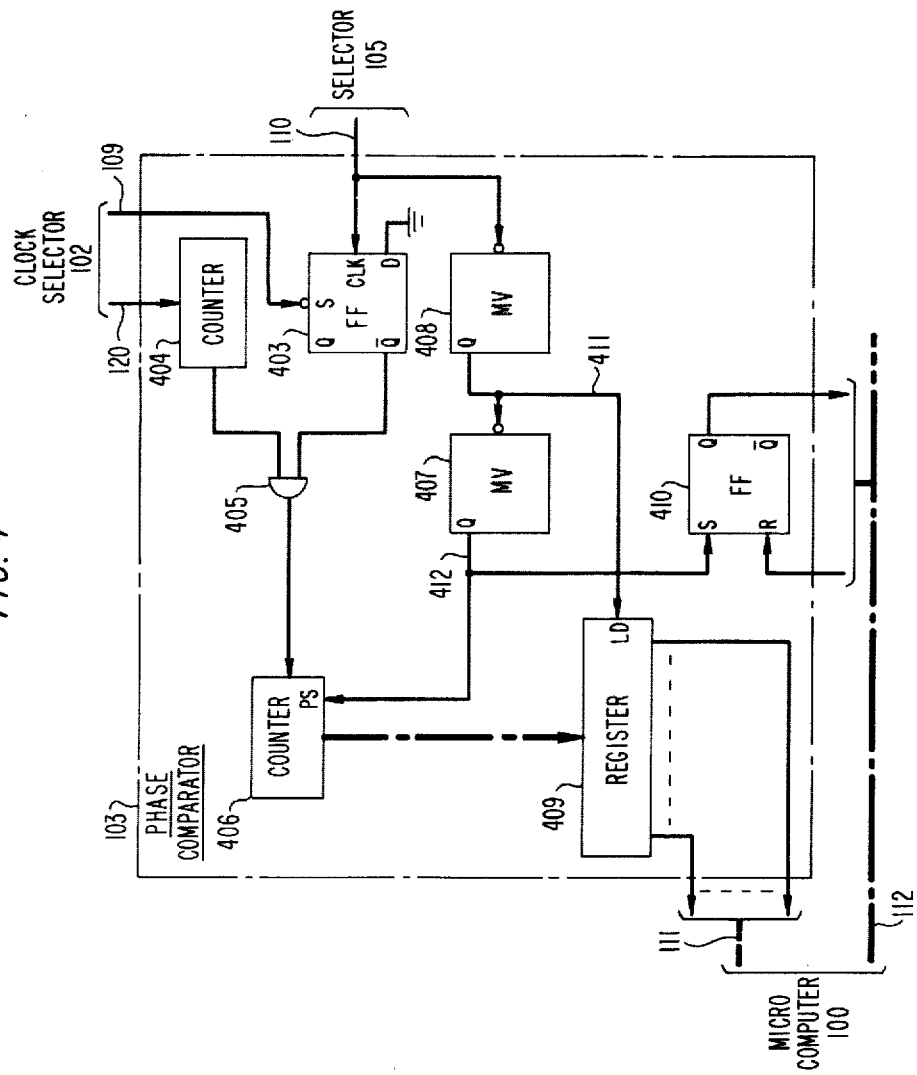
FIG. 4 is a more detailed representation of the phase comparator of FIG. 1.

Phase comparator 103 is shown in greater detail in FIG. 4. The function of phase comparator 103 is to calculate a phase error between the clock oscillator signal and the external reference signal and to transmit a phase error in the form of a 9-bit word, to microcomputer 100 via cable 111. The reference signal is transmitted to the phase comparator via conductor 110 from either timing extractor 105 or 106 and has a frequency of approximately 4 kilohertz. An oscillator output signal having a frequency of approximately 16.384 megahertz is received via conductor 120 from clock selector 102. Clock selector 102 also derives an 8 kilohertz frame pulse from the output of the master oscillator and provides it on conductor 109. The 16.384 megahertz clock signal is transmitted on conductor 120 and is counted down at the phase comparator 103 to produce a signal of approximately 4.096 megahertz. Phase comparison consists of starting counter 406 with the leading edge of the 4 kilohertz reference signal, and subsequently stopping it with the next 8 kilohertz frame pulse. Counter 406 is a 9-bit counter which is preset to minus 256 at the start of each 4 kilohertz reference signal and is incremented by the 4.096 megahertz signal. No phase error exists if the 8 kilohertz frame pulse is located in the middle of the 4 kilohertz reference signal, and the counter will contain a zero after being stopped by the 8 kilohertz frame pulse.

Figure 7:
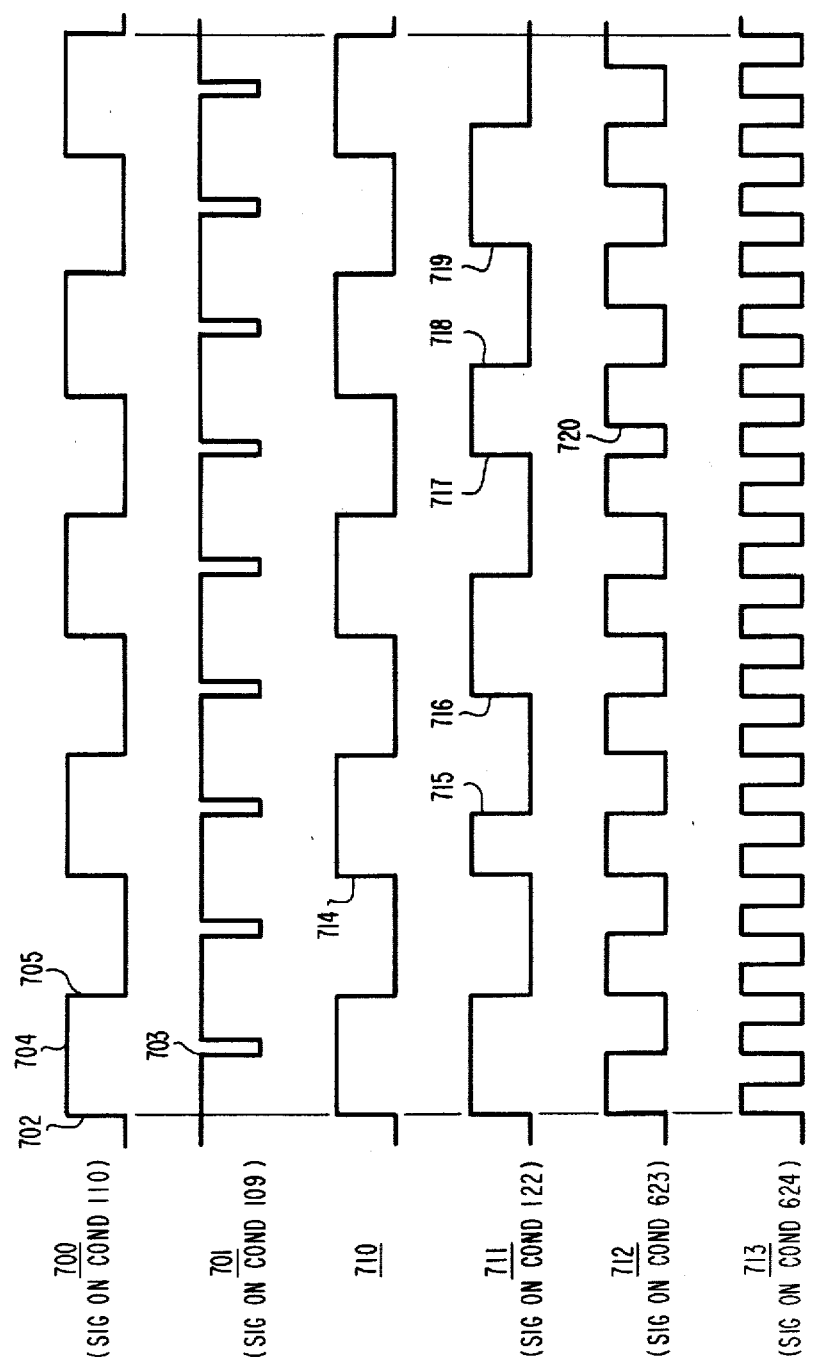
FIG. 7 is a diagrammatical representation of a number of signal pulses occurring in the circuits of the drawing.

FIG. 7 shows representations of signals on the conductors connected to phase comparator 103. The 8 kilohertz frame pulse on conductor 109 is shown as line 701 and the 4 kilohertz reference signal on conductor 109 is shown as line 700. The phase error is defined as zero when midpoint of the pulse on conductor 110, which is point 704 and negative going edge of the pulse on conductor 109 which is point 703, coincide. If point 703 falls to the left of point 704, the phase error is considered to be negative; and if the point 703 falls to the right of point 704, the phase error is considered to be positive. The phase deviation or phase error is calculated by presetting counter 406 to −256 on the rising edge of the signal on conductor 110. Counter 406 is incremented by a 4.096 megahertz signal until the negative going edge of the signal on conductor 109 occurs (point 703). At that time, counter 406 contains the phase error word, which is transferred to register 409 for transmission to microcomputer 100.

The rising edge of the pulse on conductor 110 resets D flip-flop 403 via the clock input CLK. D flip-flop 403 being reset enables AND gate 405 to transmit the signal received from counter 404 to counter 406. Counter 404 receives the 16.384 megahertz signal on conductor 120 and produces the 4.096 megahertz used to increment counter 406. When the signal on conductor 109 goes to a "0" (point 703 in FIG. 7), D flip-flop 403 is set which disables AND gate 405 and stops counter 406. The negative going transition of the signal on conductor 110 (point 705) causes monostable multivibrator 408 to transmit a pulse on conductor 411. The pulse on conductor 411 gates the contents of counter 406 into register 409. The negative going edge of the pulse on conductor 411 causes monostable multivibrator 407 to transmit a pulse on 412 which presets counter 406 to −256. The pulse on conductor 412 also sets the RS flip-flop 410 via the S input. When flip-flop 410 is set, a "1" is transmitted via cable 112 to microcomputer 100, indicating to the microcomputer that there is a phase error word in register 409. Microcomputer 100 resets RS flip-flop 410 by transmitting a pulse via cable 112 which resets the RS flip-flop 410 via the R input.

The one of the oscillators 101-a or 101-d which has been designated as the master oscillator is synchronized to the selected external reference signal using the phase-locking technique. There are conditions under which the frequency of the master oscillator and the frequency of the external source are quite close, but the phase difference is quite substantial. These conditions can arise during initial startup or after the external reference signal has been momentarily interrupted. If this situation arises, it is not desirable to vary the frequency of the master oscillator so as to shift the phase of the master oscillator significantly. Instead, the microcomputer 100 controls the extractor circuits 105 and 106 to shift the phase of the reference signal. During an initial start, microcomputer 100 adjusts the phase of the selected external reference signal for a phase error of zero. After a temporary interruption in the transmission of the external reference signal, microcomputer 100 adjusts the phase of the external reference signal so that the phase error is identical to the phase error before the transmission was interrupted.

Figure 6:
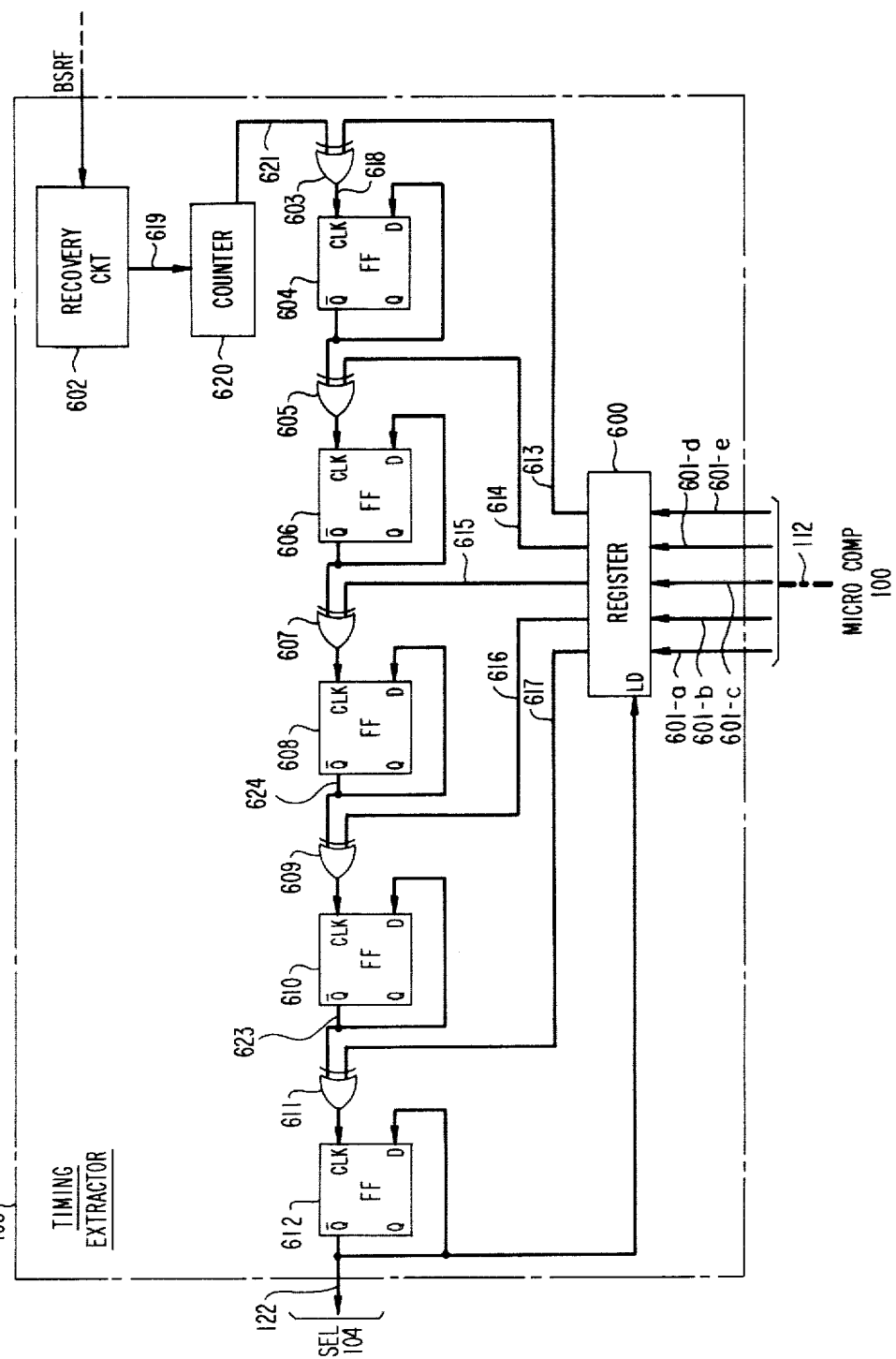
FIG. 6 shows the circuit arrangement of one of the timing extractors of FIG. 1.

Timing extractor 106 may be any well-known circuit for extracting timing pulses from a T1 channel. Timing extractor 105 is shown in greater detail in FIG. 6. The Bell System Reference Frequency (BSRF) is recovered from an external source by a well-known signal recovery circuit 602 which transmits a 2.048 megahertz signal on conductor 619. Counter 620 divides the 2.048 megahertz signal by 16 and transmits the result on conductor 621. Elements 603 through 612 form a divided-by-32 counter which divides the signal present on conductor 621 down to a 4 kilohertz signal which is transmitted on conductor 122. Elements 603 through 612 can also shift the phase of the signal on 621 under control of a 5-bit digital word in register 600. Microcomputer 100, via I/O 312, transmits the 5-bit word to register 600 via cable 112. This data is loaded into register 600 when the signal on conductor 122 goes from a "0" to a "1". The data in register 600 is applied to conductors 613 through 617 and controls the EXCLUSIVE OR gates (603, 605, 607, 609, and 611). For example, if a "0" is being transmitted on conductor 613, the signal on 621 is transmitted through EXCLUSIVE OR gate 603 to conductor 618 without change; but if a "1" is being transmitted on conductor 613, the signal on conductor 621 is inverted by EXCLUSIVE OR gate 603 before the signal is transmitted on conductor 618. The clock input, CLK, of each of the D flip-flops (604, 606, 608, 610, and 612) has associated with it an EXCLUSIVE OR gate controlled in the same manner as EXCLUSIVE OR gate 603. Accordingly, this circuit gives microcomputer 100 the ability to control whether the D flip-flop will toggle on the rising edge or the falling edge of the output of the previous D flip-flop.

This ability to control the flip-flops of the extractor circuit 105 allows microcomputer 100 to adjust the phase of the 2.048 megahertz signal on conductor 619. For example, the phase of the 2.048 megahertz signal can be changed 135 degrees in two steps. Initially, register 600 contains all "0s". The waveforms for this example are shown in lines 710 through 713 in FIG. 7. Line 710 shows the resulting 4 kilohertz signal if no phase shift was introduced. Line 711 shows the actual signal on conductor 122, line 712 shows the signal on conductor 623, and line 713 shows the signal on conductor 624. With all "0's" loaded into the register 600, all of the EXCLUSIVE OR gates (603, 605, 607, and 611) do not invert the signal they receive before transmitting the signal to the associated D flip-flop. Shortly, before the time of occurrence of point 714 shown on line 710, microcomputer 100 transmits a data word "10000" to register 600 which is gated into the register under control of the signal on conductor 122 shortly after point 714. Consequently, a "1" is applied to conductor 617, causing EXCLUSIVE OR gate 611 to perform the functions of an inverter with respect to the signal on conductor 623. Accordingly, the negative going signal on conductor 623 starting at point 715 is inverted and applied to D flip-flop 612 as a positive pulse causing this flip-flop to change state. This change of state at point 715 occurred one-quarter cycle early because the inversion was introduced at gate 611. From a comparison of the waveforms of lines 711 and 710 at point 716, it can be seen that the phase of line 711 has advanced 90 degrees with respect to the phase of line 710. An additional phase shift of 45 degrees may be achieved by inserting data word "11000" in register 600 at point 717. Now, both EXCLUSIVE OR gates 611 and 609 are functioning as inverters. Accordingly, the signal on 624 is also inverted after point 717 causes a positive signal to be applied to flip-flop 610 at point 718 causing flip-flop 610 to change state one-quarter cycle early. However, since the waveform on conductor 624 changes at twice the frequency of the output waveform, this change is equivalent to a 45 degree change. The effect of the change can be seen from a comparison of the waveforms at point 719. It is apparent that waveform 711 is advanced by 135 degrees with respect to the waveform on line 710. By selective loading of register 600 various phase shifts can be accomplished. For example, a "1" on conductor 615 results in a phase shift of 22.5 degrees; a "1" on conductor 614 results in a phase shift of 11.25 degrees; and a "1" being transmitted on conductor 613 results in a phase shift of 5.625 degrees. If register 600 contains all "1's", the total phase shift is 174.375 degrees.

Figure 5:
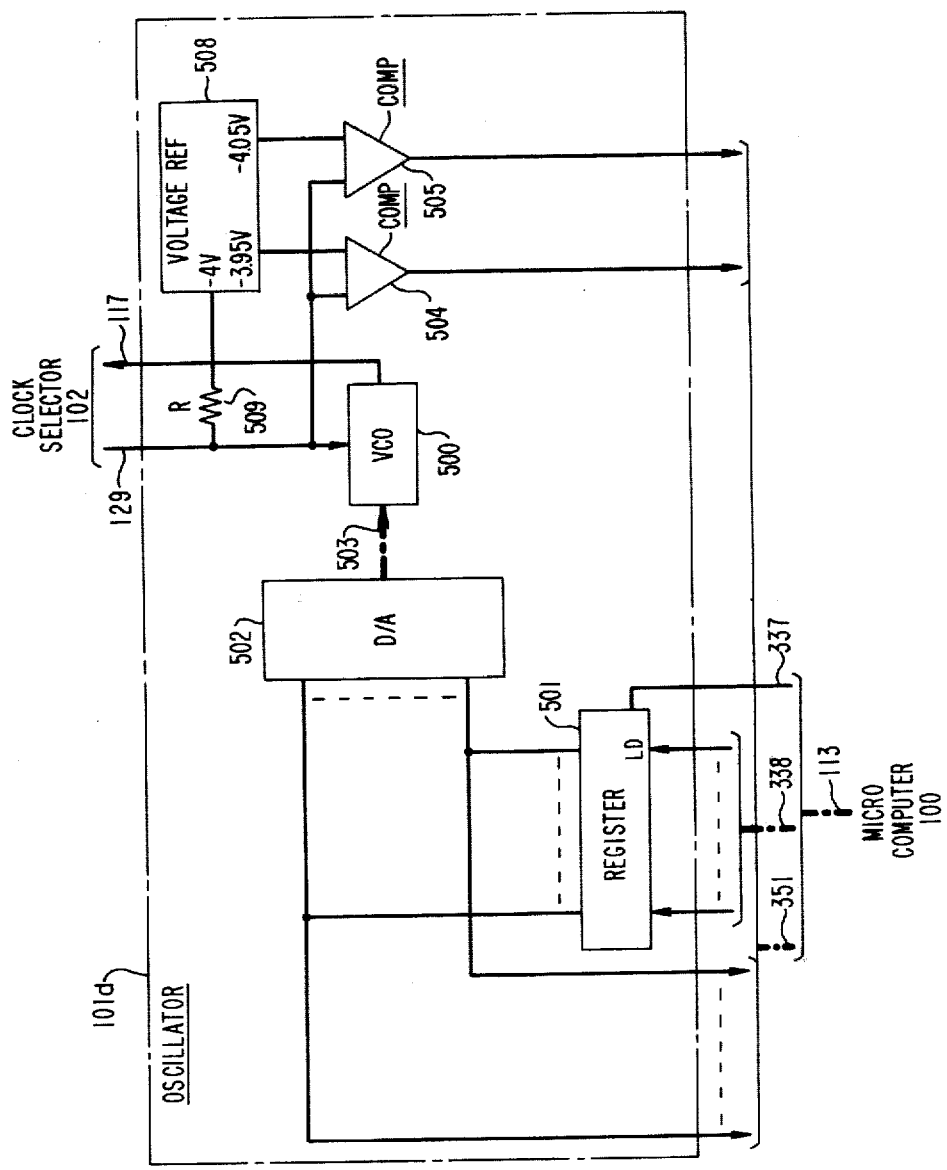
FIG. 5 is a representation of the clock oscillator circuits of FIG. 1.

Oscillator 101-d is shown in greater detail in FIG. 5. The basic oscillator signal is generated by a well-known voltage controlled oscillator, VCO 500, which transmits its output signal via conductor 117. The frequency of this signal is determined by an analog voltage signal on conductor 129 and conductor 503. The voltage on conductor 503 is determined by the contents of register 501. Digital-to-analog converter, D/A, 502 converts the 14-bit digital word in register 501 to an analog signal and transmits it to VCO 500 via conductor 503. As has been previously described, microcomputer 100 calculates and transmits the 14-bit word to register 501 via conductors 338. Also, as was previously described, microcomputer 100 loads this digital word into register 501 by transmitting a pulse on conductor 337. Microcomputer 100 has the ability to read the contents of register 501 via conductors 351. Oscillator 101-d may be the master oscillator or a slave. When it is the master, its signal will be compared against a reference by means of phase comparator 103. Further, microcomputer 100 will periodically compute a digital control word and transfer it to register 501 to cause the signal on conductor 117 to maintain phase-lock with respect to the reference signal. Under this condition, no control signal is applied to conductor 129. However, when oscillator 101-*d* is a slave, an analog control signal will be applied on conductor 129 from a phase-lock circuit in the clock selector 102. When oscillator 101-*d* is the master oscillator, clock selector 102 electrically disconnects conductor 129 presenting an open circuit impedance on conductor 129. In that case, voltage reference source 508 maintains a −4 volts level on conductor 129. When oscillator 101-*d* is a slave oscillator, the phase-lock circuit in clock selector 102 compares the frequency of the output signal of VCO 500 with that of the master and applies a correction signal to conductor 129 to cause the signal on conductor 117 to phase-lock to the master frequency. This is a well-known technique. The analog phase-lock circuit applies a correction signal to conductor 129 by sourcing or sinking current into or from voltage reference 508 via conductor 129 and register 501 to maintain the correct voltage on conductor 129.

If the slave oscillator has to become the master oscillator, a problem may arise since the voltage on conductor 127 may not be equal to −4 volts at the time of transition from slave to master. For example, if the voltage on conductor 129 has to be −2.5 volts to maintain the correct frequency output in the slave mode, a transition from slave to master mode causes the voltage on conductor 129 to go from −2.5 volts to −4 volts. The resulting change in the voltage on conductor 129 causes a substantial change in the frequency output of VCO 500. Comparators 504 and 505 shown in FIG. 5 give microcomputer 100 the ability to determine whether the voltage on conductor 129 is within a prescribed range, e.g., ±50 mv of the −4 volt reference. If the voltage on conductor 129 is greater than −3.95 volts, comparator 504 will transmit a "1" on conductor 351; and if the voltage on conductor 129 is less than −4.05 volts, comparator 505 will transmit a "1" on conductors 351.

The circuit of FIG. 5 allows the voltage on conductor 129 to be maintained at −4 volts±50 mv while in the slave mode. Microcomputer 100 can detect when the voltage on conductor 129 is within the ±50 mv range by monitoring the outputs of comparators 504 and 505. Microcomputer 100 by execution of routines in firmware, adjusts the digital word in register 501 until the outputs of both comparators 504 and 505 are zero. Once the outputs of comparators 504 and 505 are zero, microcomputer 100 then determines approximately the value of the digital word which is needed in register 501 to make the voltage on conductor 129 equal to −4 volts. First, microcomputer 100 adjusts the output frequency of VCO until the voltage on conductor 129 is just greater than −3.95 volts. This condition causes comparator 504 to transmit a "1" to microcomputer 100 via cable 113. The error correction word in register 501 then defines the −3.95 volt point. Next, microcomputer 100 adjusts the error correction word in register 501 until the voltage on conductor 129 is just less than −4.05 volts, which causes comparator 505 to transmit a "1" to microcomputer 100 via cable 113. Finally, microcomputer 100 takes the average of the two digital words which determined the −3.95 volts and −4.05 volts points and loads this average into register 501.

Since VCO 500 is linear with respect to the voltage on conductor 503, this average value in register 501 results in approximately −4 volts on conductor 129. Now, if the slave oscillator becomes the master, there will be a minimal voltage transition on conductor 129 and the frequency of VCO 500 will change very little.

System interface 107 is shown in greater detail in FIG. 8. It consists essentially of a controller 800, a plurality of buffer circuits for gating information to connecting buses and a plurality of latches for temporarily storing information bits. The controller 800 comprises a sequencing circuit which is responsive to control signals from control processor 108 to control the other circuits in the system interface 107. By using system interface 107, central processor 108 can perform the functions of initialization, error detection and message transfer with respect to microcomputer 100. Controller 800 is connected to central processor 108 via bus 117 and responds to control signals on bus 116 to write data from bus 116 into latches 801 or 802 and to read data from buffers 803 or 806 onto bus 116. It is connected to microcomputer 100 via cable 115. Central processor 108 can transmit pulses on certain conductors contained in cable 115 via controller 800. Central processor 108 can stop microprocessors 300 and 301 in microcomputer 100 by transmitting the necessary control signals on bus 116 to cause controller 800 to transmit a pulse on conductor 339. The pulse on conductor 339 causes microprocessor 300 and 301 to enter a halt state. Central processor 108 can start microcomputer 100 by transmitting the necessary control signals to cause controller 800 to transmit a pulse on conductor 340. In response to a pulse on conductor 340, microprocessor 300 and 301 start executing instructions at a predetermined location.

Central processor 108 transmits a message to microprocessors 300 and 301 by writing the message into RAMs 302 and 308 and causing an interrupt to microprocessors 300 and 301. To accomplish this, central processor 108 transmits the necessary control signals and address information identifying the memory location to be written in RAMS 302 and 308, on bus 116. Controller 800 responds to the control signals on bus 116 to gate the address information on bus 116 into latches 801 by pulsing conductor 816. Central processor 108 transmits the necessary control signals and the data to be written into RAMs 302 and 308, on bus 116. Controller 800 responds to the control signals by transmitting a pulse on conductor 817 which loads the data contained on bus 116 into latches 802. Central processor 108 now transmits to controller 800 the necessary control signals which cause controller 800 to perform the following sequence of operations. First, controller 800 transmits a "1" on conductor 345, which causes a request for direct memory access in both microprocessors. Second, after microprocessors 300 and 301 transmit acknowledge signals on conductors 346 and 347 causing AND gate 813 to transmit a "1" on conductor 814, controller 800 activates buffers 803 through 811 by means of conductors 819 and 820 to transmit the contents of latches 801 and 802 onto buses 319 and 311, respectively. Third, controller 800 generates a write control pulse on conductor 821 which is transmitted via buffers 812, and conductors 823 and 824 to buses 310 and 311. Fourth, controller 800 transmits a "0" on conductor 345. By these operations, the data contained in latches 802 is written into the microprocessor address locations defined by latches 801. A read operation from RAMs 302 and 308 is similar. For the read operation, no data is written into latches 802 and buffers 809 and 808 are not enabled. A read pulse is transmitted to RAMs 302 and 308 by pulsing conductor 822 which results in read signals being transmitted on buses 310 and 311 by conductors 824 and 826. The data read out of RAMs 302 and 308 is gated into latches 804 by a signal on conductor 827. Central processor 108 reads the contents of latches 804 by transmitting the necessary control signals to controller 800 which transfers the contents of latches 804 onto bus 116 by enabling buffers 803 via conductor 818.

A number of error conditions may be detected by microprocessors 300 and 301 which are recorded in error register 805 which contains a flip-flop for each error condition. When an error is detected in microprocessors 300 or 301, a signal is transmitted on conductors 327 or 348, to set one of several flip-flops in error register 805. If a flip-flop is set in error register 805, NOR gate 807 transmits a "0" on conductor 361 which inhibits the microprocessors from writing data into an oscillator at the I/O units 313 and 314. Central processor 108 periodically reads the state of the error register by transmitting the necessary control signals on bus 116 to controller 800. Controller 800 responds by enabling buffers 806 via conductor 828 to place the contents of the error register 805 onto bus 116 where the data can be read by central processor 108. Central processor 108 resets error register 805 via controller 800 and conductor 815.

Both microproccessors 300 and 301 of FIG. 3 periodically compute a control word CW for transmission to the master oscillator, as described earlier herein. The control words are transmitted in incremental steps to avoid drastic variations in frequency of the oscillator. During the computation of each new control word, tests are made to determine the magnitude of the difference between the new control word and the latest priorly computed control word. If it is found that the difference is greater than an upper threshold (e.g., decimal 256) an error indication will be given. If the magnitude is greater than a lower threshold (e.g., decimal 64) but less than the upper threshold, a control word which differs from the prior word by no more than decimal 64 is transmitted to the oscillator. Subsequently, another control word will be sent which differs from the latest transmitted control word by no more than decimal 64. Repeated transmissions of control words will be made in steps of 64 or less until a control word equal to the computed control word has been transmitted. Clearly, if the magnitude of the difference between the prior word and the computed word is less than the lower threshold, only one word needs to be transmitted.

Figure 9:
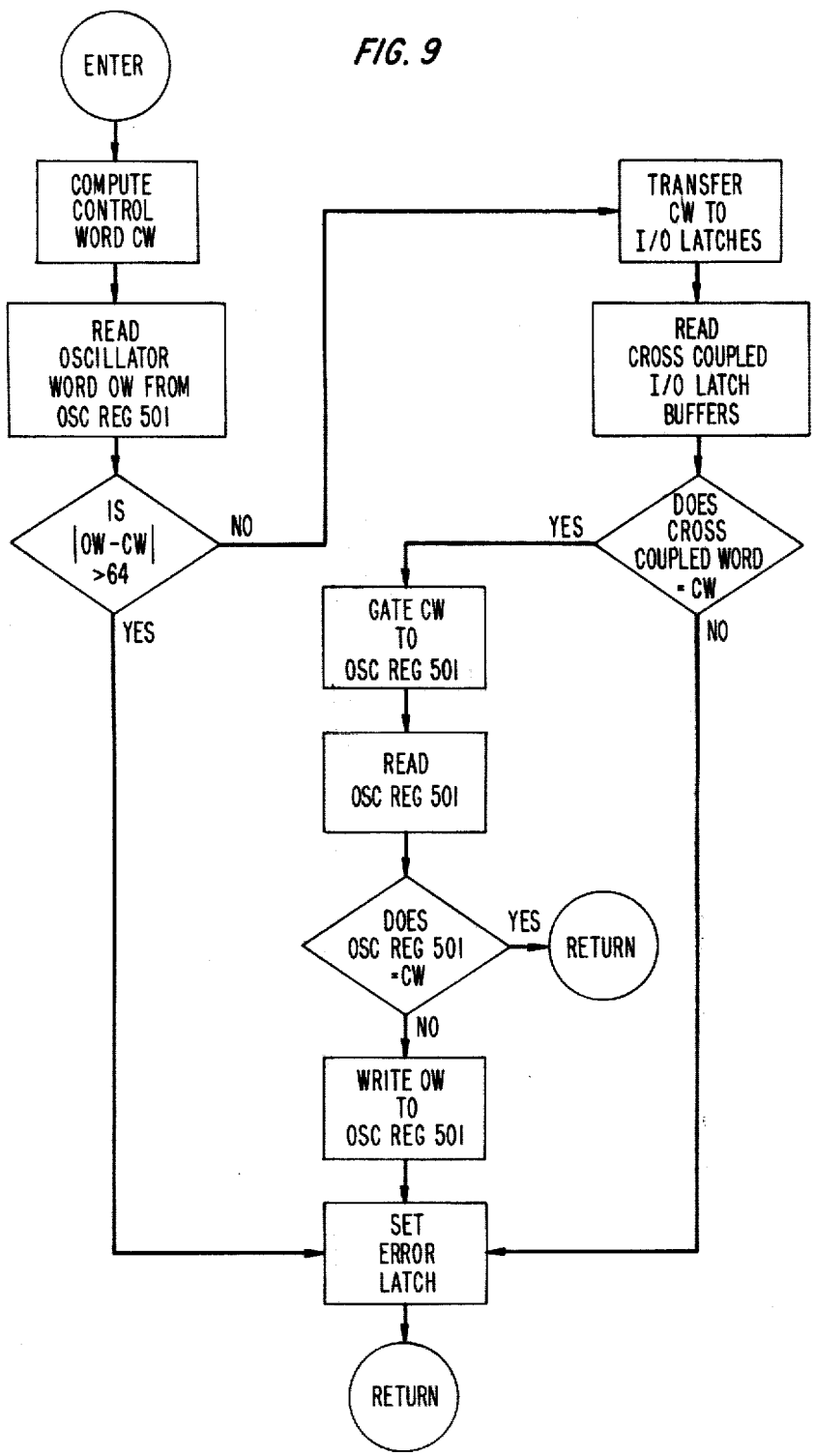
FIG. 9 is a flowchart representation of one of the tasks performed in the circuit.

FIG. 9 is a flowchart representation of a sequence of functions executed by the microprocessors 300 and 301 of FIG. 3 as part of the transfer of a new control word to an oscillator. Before the new control word is transmitted to the oscillator register for example, register 501 shown in FIG. 5, the current word stored in register 501 is read by both microprocessors via buffer circuits 318 and 323 shown in FIG. 2. Next, the two microprocessors compute the difference between the control word read from the oscillator and the newly computed control word and cause an error latch to be set if this difference is greater than the decimal number 64. The error latch is part of latches 324 shown in FIG. 2. This causes a signal to be transmitted over conductor 348 to error register 805 of FIG. 8 thereby setting an error indication flip-flop in the error register. In the event that the error latch is set, the control word transfer routine will be terminated. In the event that the magnitude of the difference between the word read from oscillator register 501 and the new control word is less than decimal 64, each microprocessor will transfer the new control word to the associated I/O latches 319 and 322 shown in FIG. 2. As explained earlier, the latches are cross-coupled to the nonassociated microprocessor via conductors 338 and 350 at buffer circuits 318 and 323 shown in FIG. 2. The next step in the program after writing of the I/O latches, is to read the corresponding buffers. The cross-coupled words are matched by the microprocessors against the computed word CW. If a mismatch occurs, an error indication will be given and the routine terminated. If there is no mismatch, a new control word will be gated to oscillator 501 by means of a signal on conductor 337. This conductor is the output of strobe control circuit 360 shown in FIG. 2, and the gating signal will be generated on conductor 337 when the appropriate address and write control signals are generated simultaneously by the two processors. The next step in the program routine is to read the contents of register 501 which is accomplished by reading buffer circuits 318 and 323. These buffer circuits are connected to the output terminals of register 501 by means of conductors 351. Next, the microprocessors compare the contents of register 501 with the computed control word which was transmitted to that register. If the two are identical, the routine is terminated. If they are not identical, the word which was found in oscillator register 501 prior to the start of the transfer routine will be restored to that register and the error latch will be set. The routine will then be terminated.

It is to be understood that the above-described arrangement represents merely an illustrative application of the principles of the invention. Numerous other arrangements may be devised by those skilled in the art without departing from the spirit and scope of the invention.

What is claimed is:

1. A clock pulse generator synchronizing arrangement comprising:

digitally controllable clock oscillator means for generating clock output signals; and phase comparator means for generating a phase signal indicative of the phase difference between said clock output signals and reference signals;

characterized in that said arrangement comprises programmable processor means responsive to said phase signal for generating digital control signals in the form of a binary word and for generating an error signal when the magnitude of a generated binary word does not fall within predetermined limits;

means for transferring said control signals from said processor means to said clock oscillator means; and means responsive to said error signal for inhibiting the transfer of said control signals to said oscillator means.

2. A clock pulse generator synchronizing arrangement comprising:

digitally controllable clock oscillator means for generating clock output signals; and phase comparator means for generating a phase signal indicative of the phase difference between said clock output signals and reference signals;

characterized in that said arrangement comprises programmable processor means responsive to said phase signal for generating and transmitting control signals to said clock oscillator means;

means at said clock oscillator means for generating echo signals corresponding to said control signals received at said clock oscillator means; and means for transmitting said echo signals to said programmable processor means;

said programmable processor means being responsive to a mismatch condition between said echo signals and said control signals to prevent said clock oscillator means from responding to said control signals.

3. A clock pulse generator synchronizing arrangement comprising:

digitally controlled clock oscillator means responsive to control signals for generating clock output signals of a frequency defined by said control signals; and phase comparator means for generating a phase signal indicative of the phase difference between said clock output signals and reference signals;

characterized in that said arrangement comprises duplicated processor means, each of said duplicated processor means responsive to said phase signal to generate said control signals;

means for transferring said control signals to said clock oscillator means; and means operative in response to said control signals for inhibiting the transfer of said control signals to said clock oscillator means if said control signals from one of said duplicated processor means are not identical to control signals from other of said duplicated processor means.

4. A clock pulse generator synchronizing arrangement in accordance with claim 3 further characterized in that each of said duplicated processor means generates an address designating said clock oscillator means, and said arrangement further comprises means for comparing said addresses and for inhibiting the transfer of control signals to said clock oscillator means if said addresses are not identical.

5. A clock pulse generator synchronizing arrangement in accordance with claim 3 wherein each of said duplicated processor means comprises an input/output unit, each of said duplicated processor means being operative to read a digital control word representing said control signals in said input/output unit of the other duplicated processor means and operative to compare a control word read from the other duplicated processor means with its own generated control word and each being further operative to generate an error signal when said read control word is not identical to its own generated control word; and said inhibiting means comprises means for interconnecting said input/output units and means responsive to said error signals from either of said duplicated processor means to inhibit the transfer of said control signals to said clock oscillator means.

6. A clock pulse generator synchronizing arrangement in accordance with claim 3 further characterized in that said arrangement comprises matching means connected to each of said duplicated processor means for comparing data words representative of the operations of each of the duplicated processor means and for generating a match error signal, and said means for inhibiting the transfer of said control signals further responsive to said match error signal for inhibiting the transfer of said control signals.

7. The arrangement in accordance with claim 6 wherein each of said duplicated processor means comprises memory access buses and wherein said match circuit is connected to said memory access buses for generating parity signals over information appearing on said buses and for generating said error signals when said parity signals for said buses are not identical.

8. A clock pulse generator synchronizing arrangement comprising:

a master clock oscillator for generating master clock signals and a slave clock oscillator for generating slave clock signals, said slave oscillator responsive to an analog signal and a digital control word to vary frequency of said slave clock signals; an analog phase-lock means for generating said analog signal to control said slave oscillator such that the frequency of said slave clock signals equals the frequency of said master clock signal;

characterized in that said arrangement comprises means responsive to said analog signal to compute said digital control word such that said analog signal is adjusted to a predetermined value.

9. A clock pulse generating arrangement in accordance with claim 8, further characterized in that said arrangement comprises selector means responsive to signals of said master clock oscillator and said slave clock oscillator to disconnect said slave clock oscillator from said analog phase-lock means and to cause an analog signal of said predetermined value to be applied to said slave oscillator, whereby the frequency of said slave clock signals after disconnection will be at substantially the same frequency as that of said master clock signals.

10. A clock pulse generating arrangement comprising:

a clock oscillator means for generating clock output signals;

phase comparator means for generating a phase signal indicative of the phase difference between said clock output signals and reference signals;

characterized in that said arrangement further comprises:

pulse phase shift means for introducing a phase shift in said reference signals prior to the application thereof to said phase comparator means; and control means responsive to said phase signal for generating control signals defining said phase shift;

said phase shift means being responsive to said control signals for introducing said phase shift.

11. The arrangement of claim 10 further characterized in that said control means generates digital control signals in the form of a binary word defining magnitude of phase shift and said phase shift means is responsive to said digital word to introduce a phase shift corresponding to the magnitude of said word.

* * * * *